United States Patent [19]

Van Rompuy et al.

[11] Patent Number: 5,501,939
[45] Date of Patent: Mar. 26, 1996

[54] SPECTRALLY SENSITIZED PREFOGGED DIRECT-POSITIVE SILVER HALIDE PHOTOGRAPHIC MATERIAL

[75] Inventors: Ludo Van Rompuy, Destelbergen; Paul Coppens, Turnhout, both of Belgium

[73] Assignee: AGFA-Gevaert, N.V., Mortsel, Belgium

[21] Appl. No.: 487,246

[22] Filed: Jun. 13, 1995

[30] Foreign Application Priority Data

Jul. 1, 1994 [EP] European Pat. Off. .............. 94201899

[51] Int. Cl.⁶ .......................... G03C 1/485; G03C 8/06; G03F 7/07
[52] U.S. Cl. .................. 430/204; 430/230; 430/411; 430/569; 430/596; 430/599; 430/642
[58] Field of Search ..................... 430/204, 230, 430/596, 642, 569, 411, 599

[56] References Cited

U.S. PATENT DOCUMENTS

| | | | |
|---|---|---|---|
| 4,134,769 | 11/1979 | Yoshida et al. | 430/230 |
| 4,175,965 | 11/1979 | Yoshida et al. | 430/230 |
| 4,743,525 | 5/1988 | Yamamoto et al. | 430/642 |
| 5,427,889 | 6/1995 | Saikawa et al. | 430/230 |

*Primary Examiner*—Richard L. Schilling
*Attorney, Agent, or Firm*—Breiner & Breiner

[57] ABSTRACT

The present invention provides a photographic material with a pH at 25° C. of at most 7, containing on a support at least one layer, comprising a prefogged direct-positive silver halide emulsion spectrally sensitized with one or more electron-accepting sensitizing dyes in a total amount of at least 0.15 mmole/mole silver halide, the silver halide crystals of said prefogged direct-positive silver halide emulsion containing silver chloride for at least 60 mole %, silver bromide in a range from 0.5 mole % to 39.98 mole % and silver iodide in a range from 0.02 mole % to 2 mole %, characterized in that said silver halide cristals contain silver iodide for at least 0.20 mmole/mole AgX in the outer 10% by weight of said cristals and said layer contains a gelatin species containing $Ca^{2+}$ in an amount ranging from 0.2% to 1% by weight.

12 Claims, No Drawings

SPECTRALLY SENSITIZED PREFOGGED DIRECT-POSITIVE SILVER HALIDE PHOTOGRAPHIC MATERIAL

FIELD OF THE INVENTION

The present invention relates to a direct positive type silver halide photographic material with high sensitivity. The present invention further relates to a method for obtaining images with said photographic material and to a method for obtaining a lithographic printing plate with said photographic material.

BACKGROUND OF THE INVENTION

With recent rapid progress of information transmitting systems, silver halide photographic materials have been increasingly required to have high sensitivity. This high sensitivity is a necessity as well in the field of negative working as of positive working silver halide photographic materials. A negative working photographic material is one giving a negative image while a positive working photographic material is one giving a positive image. The term negative image means that image reversal occurred while the term positive image indicates that no image reversal took place.

So, for a photographic material to be suitable for use in graphical applications it is required that the material is of high speed to the applied illumination, it being a classical analogous one or a so-called high intensity-short time exposure (flash exposure or scanning exposure) and yields images of high contrast and high resolving power.

Photographic materials for graphic applications include photographic films and papers used after processing as interoriginals in a process for preparing a lithographic printing plate and silver salt diffusion transfer based (hereinafter called DTR-) lithographic printing plates disclosed in e.g. U.S. Pat. No. 4,501,811 and U.S. Pat. No. 4,784,933. With the latter materials a lithographic printing plate can be obtained without the need of a photographic interoriginal.

In most cases it is required that said interoriginals have a negative image because most printing plates are negative working. Time and cost are then saved when said interoriginals are prepared by phototypesetting when using a positive working silver halide photographic material e.g. a photographic material comprising a positive working (hereinafter called direct-positive) silver halide emulsion.

In the conventional DTR-process i.e. a DTR-process wherein a photographic material comprising a negative working (hereinafter called negative) silver halide emulsion is used a positive image is formed in the receiving layer.

At the exposed areas of the silver halide emulsion layer the silver halide is developed (chemical development) and thus cannot be dissolved anymore to diffuse to the receiving layer.

At the unexposed areas of the silver halide emulsion layer the silver halide is converted into a soluble silver complex salt and is transferred to the receiving layer, where it forms a silver image usually in the presence of physical development nuclei.

If a negative image of the original is to be formed in the receiving layer a photographic material comprising a direct-positive silver halide emulsion should be used. The formation of negative images from the original are interesting where positive DTR-images are desired from negatives or vice versa.

It is further known to make lithographic printing plates by the DTR-process.

Here too printing plates made by the conventional DTR-process are of the positive type and a photographic material comprising a direct-positive silver halide emulsion is required in the DTR-process to obtain a positive printing plate starting from negative originals.

Furthermore the conventional positive type DTR-process for direct plate making by lasers and scanners e.g. computer to plate applications which are widely employed, have the disadvantage of requiring a long exposure time since the non-image areas of the negative silver halide emulsion layer should be exposed in order to obtain in the image receiving layer image areas that are printing. Thus for computer to plate applications it is also desirable to have a DTR-material comprising a direct-positive silver halide emulsion.

For the formation of a direct-positive image in the silver halide emulsion layer two main types of direct positive silver halide emulsions are known.

One type is a silver halide emulsion that has been prefogged. Such types of emulsion are commonly known as Herschel reversal emulsions and are described in e.g. U.S. Pat. No. 3,367,778. U.S. Pat. No. 3,733,199 discloses the use of such a type of emulsion for use in a diffusion transfer process. U.S. Pat. No. 4,149,889, U.S. Pat. No. 4,175,965 and JP-Pi 01-96648 describe the use of Herschel reversal emulsions for the production of a negative type lithographic printing plate.

The second type of direct positive emulsions are inner latent image type silver halide emulsions that have not been previously prefogged. Such a type of direct positive emulsions is disclosed in e.g. EP-A365.926. U.S. Pat. No. 4,309,499 discloses its use in a DTR imaging element.

This last type of direct positive emulsion shows normally a higher speed than the first type but can not be developed in the classical way. While with the first type of direct positive type emulsions a positive image in the emulsion layer is obtained by effecting a normal surface development, the second type of direct positive type emulsions requires a supplementary fogging treatment subsequent to the imagewise exposure before or while applying a normal surface development.

SUMMARY OF THE INVENTION

It is an object of the present invention to provide a photographic material comprising a layer containing a direct-positive silver halide emulsion, having a high sensitivity, developable in a classical surface developer without a supplementary treatment and that can yield images of good quality, especially of high contrast.

It is another object of the present invention to provide a method for obtaining said photographic material.

It is further object of the present invention to provide a method for obtaining an image with said photographic material.

It is a still further object of the present invention to provide a method for obtaining with said photographic material an imaging element having a high sensitivity that can be used for obtaining a lithographic printing plate of high contrast according to the silver salt diffusion transfer process in a classical silver salt diffusion transfer processing.

It is an even further object of the present invention to provide a method for obtaining a lithographic printing plate of high contrast and good printing properties according to the silver salt diffusion transfer process by using said imaging element.

Further objects of the present invention will become clear from the description hereinafter.

According to the present invention there is provided a photographic material with a pH at 25° C. of at most 7, containing on a support at least one layer, comprising a prefogged direct-positive silver halide emulsion spectrally sensitized with one or more electron-accepting sensitizing dyes in a total amount of at least 0.15 mmole/mole silver halide, the silver halide crystals of said prefogged direct-positive silver halide emulsion containing silver chloride for at least 60 mole %, silver bromide in a range from 0.50 mole % to 39.98 mole % and silver iodide in a range from 0.020 mole % to 2.0 mole %, characterized in that said silver halide cristals contain silver iodide for at least 0.20 mmole/mole AgX in the outer 10% by weight of said cristals and said layer contains a gelatin species containing $Ca^{2+}$ in an amount ranging from 0.20% to 1% by weight.

According to the present invention there is also provided a method for obtaining the above mentioned photographic material by —preparing a prefogged direct-positive silver halide emulsion comprising the steps of (i) formation of a silver halide emulsion by precipitation in an aqueous medium of silver halide crystals containing silver chloride for at least 60 mole %, silver bromide in a range from 0.50 mole % to 39.98 mole % and silver iodide in a range from 0.020 mole % to 2.0 mole %, (ii) desalination of said silver halide emulsion, (iii) prefogging of said silver halide emulsion, (iv) adding one or more electron-accepting sensitizing dyes to said prefogged silver halide emulsion in a total amount of at least 0.15 mmole/mole silver halide and (v) adjusting the pH of said spectrally sensitized prefogged silver halide emulsion so as to obtain a photographic material with a pH at 25° C. of at most 7 and —coating on a support at least said spectrally sensitized prefogged silver halide emulsion layer, characterized in that one of more water soluble iodide salts are added to the emulsion of said silver halide cristals in a stage after the addition of at least 90% of the silver salt in a total amount from 0.20 mmole/mole AgX to 0.020 mole/mole AgX and a gelatin species containing $Ca^{2+}$ in an amount ranging from 0.20 % to 1% by weight is added to said aqueous medium before adding said one or more electron-accepting sensitizing dyes to said prefogged silver halide emulsion.

According to the present invention there is also provided a method for obtaining an image with the above defined photographic material by exposing said photographic material followed by development.

According to the present invention there is also provided a method for obtaining an imaging element by coating on a support at least one silver halide emulsion layer as defined above and an image receiving layer containing physical development nuclei in water permeable relationship with said silver halide emulsion layer.

According to the present invention there is also provided a method for obtaining a lithographic printing plate according to the silver salt diffusion transfer process comprising image-wise exposing an imaging element as described above and developing said imaging element using an alkaline processing liquid in the presence of developing agent(s) and a silver halide solvent.

DETAILED DESCRIPTION OF THE PRESENT INVENTION

After extensive research it has been found that a silver halide photographic material with a specified value of pH, containing on a support at least one layer comprising a spectrally sensitized prefogged direct-positive silver halide emulsion wherein the silver halide crystals contain silver chloride for at least 60 mole %, silver bromide in a range from 0.50 mole % to 39.98 mole % and silver iodide in a range from 0.020 mole % to 2.0 mole % when said silver halide cristals contain silver iodide for at least 0.20 mmole/mole AgX in the outer 10% by weight of said crystals and said layer contain a gelatin species containing $Ca^{2+}$ in an amount ranging from 0.2% to 1% by weight has a high sensitivity. Said photographic material yields images of good quality, especially of high contrast. Furthermore, a lithographic printing plate with good printing properties can be obtained according to the silver salt diffusion transfer process by image-wise-exposing an imaging element containing such a silver halide emulsion.

The silver halide cristals of said prefogged direct-positive silver halide emulsion contain silver iodide from 0.20 mmole/mole AgX to 20 mmole/mole AgX, preferably from 0.50 mmole/mole AgX to 10 mmole/mole AgX, more preferably from 1.0 mmole/mole AgX to 5.0 mmole/mole AgX in the outer 10% by weight, preferably in the outer 5% by weight, most preferably in the outer 2% by weight of said cristals.

Preferably, the iodide is built-in into the silver halide cristals by adding one or more water soluble iodide salts to the emulsion of said silver halide cristals in the formation stage after the addition of at least 90% of the silver salt and before the onset of the prefogging, more preferably after the addition of 95% of the silver salt and before the end of the desalting of the emulsion, most preferably after the completion of the addition of the silver salt and the beginning of the desalting of the emulsion.

Said water soluble iodide salts are added to the emulsion of the silver halide cristal in the formation stage in a total amount from 0.20 mmole/mole AgX to 20 mmole/mole AgX, preferably in a total amount from 0.50 mmole/mole AgX to 10 mmole/mole AgX, more preferably in a total amount from 1.0 mmole/mole AgX to 5.0 mmole/mole AgX.

Water soluble iodide salts are preferably also added to the emulsion of the silver halide cristals in a latter stage after the addition of the electron-accepting sensitizing dye(s), preferably as the next step in the preparation of the coating layer. It is preferred to wait at least 5 minutes, more preferred at least 10 minutes after the addition of said electron-accepting sensitizing dye(s) before adding this latter portion of the water soluble iodide salt(s).

Said water soluble iodide salts are added to the emulsion of the silver halide cristal in the latter stage in a total amount from 0.10 mmole/mole AgX to 4 mmole/mole AgX, preferably in a total amount from 0.20 mmole/mole AgX to 2.5 mmole/mole AgX, more preferably in a total amount from 0.30 mmole/mole AgX to 1.5 mmole/mole AgX.

The water soluble iodide salt(s) can be added to the emulsion of the silver halide cristals in the formation stage and/or in the latter stage as solids but are preferably added as aqueous solutions. Preferably sodium and potassium iodide are used. Although a mixture of these salts can be used, the use of a sole iodide salt is preferred. Most preferred is the use of potassium iodide in an aqueous solution.

The layer of the photographic material comprising a prefogged direct-positive silver halide emulsion also contains a gelatin species containing $Ca^{2+}$ in an amount ranging from 0.20% to 1.0% by weight, preferably in an amount ranging from 0.35% to 1.0% by weight, more preferably in an amount ranging from 0.35% to 0.7% by weight, most preferably an above mentioned gelatin species whereof a 10% by weight aqueous solution at 36° C. and pH 6 has a viscosity from 10 mPas to 17 mPas at a shearing rate of 1000 $s^{-1}$.

Said gelatin species is added to the aqueous medium preferably before or during the prefogging of the silver halide emulsion, more preferably after the precipitation of the silver halide cristals and before the prefogging.

Preferably said gelatin species is added to the silver halide emulsion in an amount ranging from 10 g/mole AgX to 200 g/mole AgX, more preferably in an amount ranging from 30 g/mole AgX to 150 g/mole AgX, most preferably in an amount ranging from 60 g/mole AgX to 100 g/mole AgX.

Preferably said silver halide emulsion layer of the photographic material also comprises a $Ca^{2+}$-free gelatin species in an amount ranging from 10 g/mole AgX to 200 g/mole AgX, more preferably in an amount ranging from 50 g/mole AgX to 150 g/mole AgX.

The pAg at 25° C. of the photographic material comprising the spectrally sensitized prefogged direct-positive silver halide emulsion layer is at least 6.8, more preferably from 7 to 8, most preferably from 7.2 to 7.8.

The pH at 25° C. of the photographic material comprising the spectrally sensitized prefogged direct-positive silver halide emulsion layer is at most 7, more preferably at most 6, most preferably from 5.5 to 4.3.

The desired pAg and pH of the photographic material are preferably obtained by bringing the prefogged silver halide emulsion layer to said required pH and pAg.

The required pH of said emulsion layer is obtained by adding pH-regulating compound (acids, bases or buffers) to said emulsion layer.

The desired pAg is preferably obtained by adding water soluble bromide salt(s) to the prefogged direct-positive silver halide emulsion after the addition of said one or more electron-accepting sensitizing dyes to said prefogged silver halide emulsion and the optional latter addition of water soluble iodide salt(s), more preferably just before or after the pH of said prefogged direct-positive silver halide emulsion is adjusted, one of these two steps being usually the last one before said prefogged direct-positive silver halide emulsion is coated. Preferably sodium and potassium bromide are used. Although a mixture of these salts can be used, the use of a sole bromide salt is preferred. Most preferred is the use of potassium bromide in an aqueous solution.

The desired pAg and/or pH of the photographic material can also be obtained by coating an additional layer in water permeable relationship with said prefogged silver halide emulsion layer, containing halides preferably bromides, and/or pH-regulating compounds in such an amount that the required pAg and/or pH of the photographic material is obtained.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The pH and pAg are determined on the surface of the emulsion layer containing side of a coated and dried material.

The pH of said material is measured with a pH-meter—691 from Metrohm and a combined glass-electrode from Metrohm art. 6.0217.000. The electrode is firstly activated by dipping it for 12 hours in a 3 molar KCl solution. Afterwards, the electrode is thoroughly rinsed with demineralized water and dried. The electrode is then ready for use.

The activated electrode is dipped into demineralized water of 25° C. and then placed on the surface of the material, stored for at least one day at 25° C. and stirred slightly a few times. The electrode is then kept still for 15 seconds and the pH is registered. The electrode is then carefully rinsed again with demineralized water and dried.

The working temperature is fed into the pH-meter.

This measurement is repeated for 10 times on different places of the photographic material. The number average of the last 5 measurements is taken as the pH value of the photographic material.

The pAg of said material is measured with a pH-meter—691 from Metrohm and as electrodes a $Ag_2S$ Solids State electrode from Orion art. 941.600 and a Double Junction reference electrode Ag/AgCl with a potential of 243 mV from Orion, art. 900.200.

The $Ag_2S$ Solids State electrode is polished for use. The inner junction of the Double Junction reference electrode is filled with a saturated AgCl solution and the outer junction is filled with a 10% by weight $KNO_3$.

The surface of the material, stored for at least one day at 25 ° C. is wetted with two separate drops of demineralized water of 25 ° C., the two electrodes were each dipped into a single drop and stirred therein slightly a few times. The electrodes are then kept still for 60 seconds and the potential E" is measured in mV. The electrode is then carefully rinsed with demineralized water and dried.

This measurement is repeated for 10 times consecutively on different places of the photographic material. The number average of the last 5 measurements is taken as the potential E'value of the photographic material.

The pAg is then calculated by using the following formula:

$$pAg = \frac{799.6 - E}{59.12}$$

wherein E=E'+243 mV

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the silver halide crystals of said prefogged direct-positive silver halide emulsion contain silver chloride for at least 60 mole %, silver bromide in a range from 0.5 mole % to 39.98 mole % and silver iodide in a range from 0.02 mole % to 2 mole %. Preferably the amount of silver bromide is kept below 5 mole %, more preferably below 2 mole % and is homogeneously distributed throughout the silver halide crystals. Although there may be iodide added during the precipitation of silver halide grains before the above mentioned two stages of iodide addition, preferably most and more preferably all of the iodide is added during said two stages.

The silver halide crystals can be doped with $Rh^{3+}$, $Ir^{4+}$, etc.

The average size of the silver halide grains may range from 0.10 to 0.70 μm, preferably from 0.25 to 0.45 μm.

The silver halide emulsion is desalted by one of the well known techniques e.g. by flocculating said silver halide emulsion, washing it with water or an aqueous solution and redispersing it, by ultrafiltration, by dialysis, etc. Preferably, the desalination of the silver halide emulsion is carried out before the prefogging of the silver halide emulsion, but can also be carried out afterwards.

The prefogging of the silver halide emulsions for use in accordance with the present invention may be effected by overall exposing a silver halide emulsion to light and/or by chemically prefogging a silver halide emulsion. Chemical fog specks are preferred and may be obtained by various methods.

Chemical prefogging may be carried out by reduction or by a compound which is more electropositive than silver e.g. gold salts, platinum salts, iridium salts etc., or a combination of both. Reduction prefogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050, formaldehyde, hydrazine, hydroxylamine, sulphur compounds e.g. thiourea dioxide, phosphonium salts e.g. tetra (hydroxymethyl)-phosphonium chloride, polyamines e.g. diethylenetriamine, bis (p-aminoethyl) sulphide and its water-soluble salts, hydrazine derivatives, alkali arsenite, amine borane etc. or mixtures thereof.

When prefogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically prefogging chemical prefogging can be attained by using said fogging agents in combination with a sulphur-containing sensitizer, e.g. sodium thiosulphate or a thiocyanic acid compound e.g. potassium thiocyanate.

A preferred way for prefogging a silver halide emulsion suitable for use in accordance with the present invention is the addition of potassium chloroaurate in an amount from 0.5 mg/mole AgX to 2.5 mg/mole AgX to said emulsion at a pH from 6 to 8, at a pAg from 5 to 7, both measured at 50° C., and at a temperature from 50° C. to 55° C. during 4 to 8 hours.

Prefogged direct positive silver halide emulsions preferably comprise exterior electron traps. Prefogged direct-positive silver halide emulsions with exterior electron-traps are emulsions having adsorbed to the surface of the prefogged silver halide grains a compound accepting electrons e.g. electron-accepting dyes which may provide spectral sensitization or not or desensitizing compounds as described in e.g. the British Patent Specification 723,019.

According to Sheppard et al. J. Phys. Chem, 50 (1946), 210; desensitizers are dyestuffs whose cathodic polarographic half-wave potential, measured against the calomel electrode, is more positive than −1.0 V. It is well kown to characterize these electron-accepting or desensitizing compounds by means of their polarographic half-wave potential. Electron acceptors suitable for use in the direct-positive silver halide emulsions of the present invention have an anodic polarographic half-wave potential and a cathodic half-wave potential that when added together give a positive sum. Methods of determining these polarographic half-wave potentials have been described, e.g., in the U.S. Pat. No. 3,501,310 and U.S. Pat. No. 3,531,290.

Prefogged direct positive silver halide emulsions for use in accordance with the present invention comprise one or more electron-accepting spectral sensitizers as exterior electron trap in a total amount of at least 0.15 mmole/mole AgX, preferably in a total amount of at least 0.30 mmole/mole AgX, more preferably in a total amount from 0.50 mmole/mole AgX to 2.50 mmole/mole AgX, most preferably in a total amount from 0.85 mmole/mole AgX to 1.80 mmole/mole AgX.

The silver halide emulsion is spectrally sensitized according to the spectral emission of the exposure source for which the photographic element is designed.

Suitable electron-accepting sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green electron-accepting sensitizing dye is needed. In case of exposure by an argon ion laser a blue electron-accepting sensitizing dye is incorporated. In case of exposure by a red light emitting source, e.g. a LED or a HeNe laser a red electron-accepting sensitizing dye is used.

Other dyes, which per se do not have any spectral sensitization activity, or certain other compounds, which do not substantially absorb visible radiation, can have a supersensitization effect when they are incorporated together with said spectral electron-accepting sensitizing agents into the emulsion. Suitable supersensitizers are i.a. heterocyclic mercapto compounds containing at least one electronegative substituent as described e.g. in U.S. Pat. No. 3,457,078, aromatic organic acid/formaldehyde condensation products as described e.g. in U.S. Pat. No. 3,743,510, cadmium salts, and azaindene compounds. Preferred supersensitizers are pyridinium and chinolium derivatives and nitrogen-containing heterocyclic ring-substituted aminostilbene compounds as described e.g. in U.S. Pat. No. 2,933,390 and U.S. Pat. No. 3,635,721.

Said supersensitizers are preferably used in a total amount of at least 0.20 mmole/mole AgX, more preferably in a total amount from 0.65 mmole/mole AgX to 3.20 mmole/mole AgX, most preferably in a total amount from 1.10 mmole/mole AgX to 2.40 mmole/mole AgX.

Said compounds capable of acting as exterior electron traps and said supersensitizers are preferably added to the silver halide emulsion after the end of the prefogging, more preferably as the next step. When not only electron-accepting spectral sensitizers are used but also other desensitizing dyes or compounds or supersensitizers, said electron-accepting spectral sensitizers are preferably added after the other above mentioned compounds, but they can also be added before or between the addition of said above mentioned compounds.

The direct positive silver halide emulsions may contain emulsion stabilizers. Suitable direct positive silver halide emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable direct positive silver halide emulsion stabilizers are i.a. heterocyclic mercapto compounds, quaternary benzothiazole derivatives, and other heterocyclic nitrogen-containing compounds. Examples of such compounds have been disclosed in e.g. EP-A 496127. Other suitable direct positive silver halide emulsion stabilizers are e.g. benzenethiosulphonic acid, benzenethiosulphinic acid, benzenethiosulphonic acid amide. Said stabilizers can be added to the silver halide emulsion prior to, during, or after the prefogging thereof and mixtures of two or more of these compounds can be used.

The direct positive silver halide emulsion may contain other ingredients such as development accelerators, preferably polyalkyleneoxide derivatives having a molecular weight of at least 400 such as those described in e.g. U.S. Pat. Nos. 3,038,805, 4,038,075 and 4,292,400, wetting agents and hardening agents for gelatin may be present. The direct positive silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217.

More details about the composition, preparation and coating of direct positive silver halide emulsions can be found in e.g. Product Licensing Index, Vol. 92, December 1971, publication 9232, p. 107–109.

The photographic material of the present invention may contain additional hydrophilic layers, in water permeable relationship with the photosensitive direct positive silver halide emulsion layer.

For example it is especially advantageous to include a base-layer between the support and the photosensitive direct positive silver halide emulsion layer. In a preferred embodiment of the present invention said base-layer serves as an antihalation layer. This layer can therefore contain the same light-absorbing dyes as described above for the direct positive silver halide emulsion layer; as alternative finely divided carbon black can be used for the same antihalation purposes as described in U.S. Pat. No. 2,327,828. On the other hand, in order to gain-sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the direct positive silver halide emulsion layer the most part however preferably being present in said base-layer. As a further alternative the light reflecting pigments may be present in a separate layer provided between the antihalation layer and the photosensitive direct positive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. As explained before, the direct positive silver halide emulsion containing layer preferably has a mixture of at least two gelatin species. Unlike the direct positive silver halide emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging-element used according to the present invention may further comprise various kinds of surface-active agents in the photographic direct positive silver halide emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. poly(ethylene terephthalate) film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

According to a preferred method of the present invention the above described photographic material element is information-wise exposed in an analogous or a digital way and is subsequently developed in an alkaline processing liquid in the presence of developing agents, yielding a positive image.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used. Said developing agents may be contained in an alkaline processing liquid but are preferably contained in one or more layers of the photographic element. In the latter case the alkaline processing liquid merely serves as an alkaline activating liquid.

The pH of said alkaline liquid is preferably between 9 and 14, more preferably between 10 and 13 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents, calcium-sequestering compounds, anti-sludge agents, development accelerators and hardeners including latent hardeners.

The above described development step is preferably followed by a washing step, a fixing step and another washing or stabilizing step. The first washing step may be omitted.

The above described photographic material, obtained according to the present invention may yield an image according to the silver salt diffusion transfer process. The principles of the silver complex diffusion transfer reversal process, hereinafter called DTR-process, have been described e.g. in U.S. Pat. No. 2,352,014 and the book "Photographic Direct positive silver halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Suitable silver complexing agents also called silver halide solvents for use in accordance with the present invention are e.g. thiosulphate or thiocyanate in an amount ranging from 5 g to 20 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers, preferably di- or poly-thioethers as disclosed in e.g. U.S. Pat. No. 4.960.683 and EP-A 554,585.

Still further suitable silver halide solvents are meso-ionic compounds, preferably 1,2,4-triazolium-3-thiolates.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

Preferred physical development nuclei for use in accordance with the present invention are sulphides of heavy metals e.g. sulphides of antimony, bismuth, cadmium, cobalt, lead, nickel, palladium, platinum, silver, and zinc. Especially suitable physical development nuclei in connection with the present invention are palladium sulphide nuclei. Other suitable physical development nuclei are salts such as e.g. selenides, polyselenides, polysulphides, mercaptans, and tin (II) halides. Heavy metals, preferably silver, gold, platinum, palladium, and mercury can be used in colloidal form.

According to a preferred embodiment of the present invention a method is provided for obtaining an imaging element that can be used for obtaining a negative lithographic printing plate according to the DTR-method. Said imaging element is obtained by coating on a support in the order given at least one direct positive silver halide emulsion layer in accordance with the present invention and an image receiving layer containing physical development nuclei in water permeable relationship with said direct positive silver halide emulsion layer. Preferably the imaging element also comprises a base layer between the support and the direct positive silver halide emulsion layer as described above. A further intermediate layer between the direct positive silver halide emulsion layer and the layer containing physical development nuclei is also preferred.

A matting agent is preferably included in said base layer and optionally in small amounts i.e. from 1 to 20% by weight in the direct positive silver halide emulsion layer. When the matting agent is included in the direct positive silver halide emulsion layer it is preferable added to the direct positive silver halide emulsion after spectral sensitization of the direct positive silver halide emulsion to avoid adsorption of the sensitizer to the matting agent. Suitable matting agents for use in accordance with the present embodiment are water insoluble inorganic or organic particles having an average diameter between 1 µm and 10 µm most preferably between 4 µm and 8 µm. A preferred matting agent is silica.

The layer containing physical development nuclei is preferably free of hydrophilic binder but may comprise small amounts up to 80% by weight of the total weight of said layer of a hydrophilic colloid e.g. polyvinyl alcohol to improve the hydrophilicity of the surface.

Preferably used supports in connection with the present embodiment are paper supports or resin supports e.g. polyester film supports.

To obtain a negative lithographic printing plate the above described DTR-imaging element is information-wise exposed and is subsequently developed with an alkaline processing liquid in the presence of developing agent(s) and silver halide solvent(s). Said development step is preferably followed by a neutralization of the surface of the imaged element by guiding the element through a neutralization liquid having a pH between 4 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents, e.g. those described in U.S. Pat. No. 3,776,728, and U.S. Pat. No. 4,563,410. Preferred hydrophobizing agents are mercapto-1,3,4-thiadiazoles as described in DE-A 1,228,927 and in U.S. Pat. No. 4,563,410, 2-mercapto-5-alkyl-oxa-3,4-diazoles, 3-mercapto-5-alkyl-1,2,4-triazoles and long chain (at least 5 carbon atoms) alkyl substituted mercaptotetrazoles. Particularly preferred compounds are 5-n-heptyl-2-mercapto-1,3,4,-oxadiazol and 3-mercapto-4-acetamido-5-n-heptyl-1,2,4-triazole.

According to an alternative embodiment of the present invention another method is provided for obtaining an imaging element that can be used for obtaining a lithographic printing plate according to the DTR-method by coating in the order given on a hydrophilic surface of a support (i) an image receiving layer containing physical development nuclei and (ii) a photosensitive layer comprising a photosensitive direct positive silver halide emulsion in accordance with the present invention, said photosensitive layer being in water permeable relationship with said image receiving layer. To obtain a lithographic plate by means of the DTR-process said imaging element may be imaged using an information-wise exposure as described above followed by a development step in the presence of development agent(s) and silver halide solvent(s) so that a silver image is formed in the physical development nuclei layer. Subsequently the imaging element is treated to remove the layer(s) on top of the image receiving layer, preferably by rinsing the imaging element with water, thereby exposing the imaged surface of the support by uncovering said silver image formed in said image receiving layer. Finally the hydrophobic character of the silver image is preferably improved using a finishing liquid comprising hydrophobizing agents as described above.

The hydrophilic surface of a support can be a hardened hydrophilic layer, containing a hydrophilic synthetic homopolymer or copolymer and being hardened with a hydrolyzed tetraalkyl orthosilicate crosslinking agent coated on a flexible hydrophobic base.

More preferably an aluminum support is used as a hydrophilic base.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally post-treating of the foil. Preferably the aluminum foil has a roughness with a CLA value between 0.2 and 1.5 µm, an anodization layer with a thickness between 0.4 and 2.0 µm and is post-treated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The toughening is preferably preceded by a degreasing treatment mainly for removing ferry substances from the surface of the aluminum foil.

Therefore the aluminum foil may be subjected to a degreasing treatment with a surfactant and/or an aqueous alkaline solution.

Preferably toughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150g/l. The duration of chemical etching is preferably between 3 s and 5 min.

After toughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently be rinsed with demineralised water within a temperature range of 10°–80° C.

After the anodizing step a posttreatment such as sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To facilate the removal of the direct positive silver halide emulsion layer and to improve its photographic stability it is advantageous to provide a hydrophilic layer between the aluminum support and the direct positive silver halide emulsion layer. Preferably used hydrophilic layers for this purpose are layers comprising a hydrophilic non-proteinic film-forming polymer e.g. polyvinyl alcohol, polymer beads e.g. poly(meth)acrylate beads or mixtures thereof. Such type of layers are disclosed in EP-A-483415 and EP-A-410500.

The present invention is illustrated by the following example without limiting it thereto. All parts are by weight unless otherwise specified.

EXAMPLE I (COMPARATIVE EXAMPLE)

Preparation of prefogged direct-positive silver halide emulsions I–IV.

A gelatin silver halide emulsion of grain size 0.26 µ (98.7 mol % of chloride and 1.3 mol % of bromide) was prepared by double jet precipitation.

35 Minutes after the end of the precipitation the emulsion is flocculated and washed with demineralized water. The washed gelatino silver halogenide emulsion was peptised with low viscosity (14 mPas) $Ca^{2+}$-free gelatin and was subsequently fogged by addition of potassium chloroaurate (1.2 mg per mole of silver halide) at pH 7 and pAg 6, at a temperature of 52° C. for 5 hours. To the emulsion was added at 40° C. under continuously stirring the desensitizing dye chinolinium, 1-methyl-5-ethoxy-2-[3-nitrophenyl] ethenyl methylsulfaat (4.6 mg/g $AgNO_3$) and 20 minutes later the electron accepting spectral sensitizer A (5.6 mg/g $AgNO_3$). So, gelatin prefogged direct-positive silver halide emulsion I was obtained.

Gelatin prefogged direct positive silver halide emulsion II was prepared as emulsion I except that it was peptised with low viscosity (14 mPas) $Ca^{2+}$-containing (0.45–0.55%) gelatin Gelatin prefogged direct-positive silver halide emulsion III was prepared as emulsion I wherein however KI (2.50 mg/g $AgNO_3$) was added to the emulsion 20 minutes after the end of the precipitation.

Gelatin prefogged direct-positive silver halide emulsion IV was prepared as emulsion III except that it was peptised with low viscosity (14 mPas) $Ca^{2+}$-containing (0.45–0.55%) gelatin

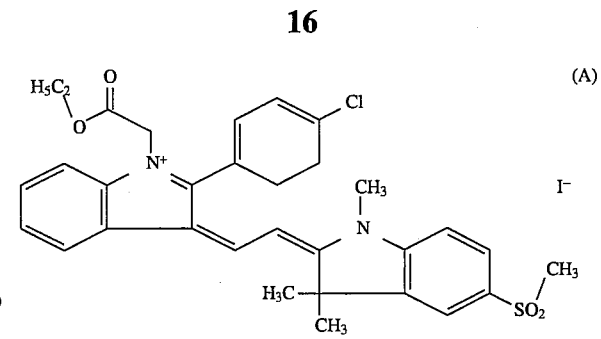

(A)

Preparation of the imaging elements 1 to 4.

A 0.30 mm thick aluminum foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0.6 µm. The aluminum plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m² of $Al_2O_3.H_2O$, treated with an aqueous solution containing 20 g/l of $NaHCO_3$ at 45° C. for 30 sec and then rinsed with demineralised water and dried.

The imaging element was obtained by coating the grained, anodized and sealed aluminum support with a silver-receptive stratum containing 1.1 mg/m² PdS as physical development nuclei.

An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 µm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value : 5.6) | 300 ml |

Finally the prefogged direct-positive silver halide emulsion I to IV were coated on the intermediate layer after adjusting at 40° C. the pH at 5 with sulfuric acid and adding 0.060 mole potassium bromide per mole silver halide, with the silver halide being provided in an amount corresponding to 2.40 g of silver nitrate per m² and the gelatin content of the emulsion layer being 1.58 g/m², consisting of 0.7 g/m² of a $Ca^{2+}$-free gelatin with a viscosity of 21 mPa.s and the remainder of the $Ca^{2+}$-containing gelatin with a viscosity of 14 mPa.s The imaging elements were exposed for 5 s through an internegative on an Opticopy imposer (registered trade name of OPTICOPY INC, Kansas, U.S.A., equipped with a green light source contact screen and immersed for 10 s at 24° C. in a freshly made developing solution having the following ingredients:

| | |
|---|---|
| carboxymethylcellulose | 4 g |

-continued

| | |
|---|---|
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to-form a silver image in the image receiving layer.

To remove the developed silver halide emulsion layer and the intermediate layer from the aluminum foil the developed monosheet DTR material was rinsed for 6 s with a water jet at 40° C.

Next, the imaged surface of the aluminum foil was guided for 15 s through the finisher having a temperature of 40° C. to enhance the water-receptivity of the non-image areas and to make the image areas oleophilic ink-receptive. In this way, four printing plates were prepared. The finisher had the following composition:

| | |
|---|---|
| AKYPO-OP-80 (trade mark for a surfactant sold by Chemische Fabrik Chem-Y, Gmbh, Germany) | 250 mg |
| $NaH_2PO_4.2H_2O$ | 20.0 g |
| potassium nitrate | 12.5 g |
| citric acid | 20.0 g |
| 2-mercapto-5-n.heptyl-oxa-3.4-diazole | 0.5 |
| sodium hydroxide | 5.5 g |
| HO $(CH_2CH_2O)_{33}$H | 75 g |
| water to make | 1000 ml |
| pH (20° C.) = 6 | |

The sensitometric properties of the developed imaging elements were characterized by the reflection density in the image areas ($D_{max}$) and non-image areas ($D_{min}$) and by the yield of silver deposited in the printing areas of the plate. The results are given in the following table 1.

TABLE 1

| Sample nr | Emulsion nr | $D_{min}$ | $D_{max}$ | $Ag/m^2$ |
|---|---|---|---|---|
| 1 | I | 0.26 | 0.26 | 0 mg |
| 2 | II | 0.26 | 0.26 | 0 mg |
| 3 | III | 0.26 | 0.26 | 0 mg |
| 4 | IV | 0.30 | 1.01 | 1.09 mg |

The developed imaging element 4 was used as printing plate. The printing plate was mounted on an offset printing machine (HEIDELBERG GTO-46). A mixture of AQUA TAME 7035E at a 3% concentration and AQUA AYDE 7022A at a 4% concentration, both marketed by Anchor/Lithemko Inc., Florida, U.S.A. was used in an aqueous solution containing 10 % isopropanol as dampening solution and K+E 123 W, marketed by Kast+Ehinger, A.G., as ink. Up to 65.000 good copies were printed from said plate.

Evaluation:

From these results it is seen that the photographic silver halide material 4, comprising the prefogged direct-positive silver halide emulsion IV (material according to the invention) has a much higher sensitivity than the photographic materials 1 to 3, comprising the prefogged direct-positive silver halide emulsions I to III (the photographic materials 1 to 3 being comparative materials). Furthermore, it is seen that said photographic materials can be used for preparing lithographic printing plates with good printing properties.

We claim:

1. A photographic material with a pH at 25° C. of at most 7, containing on a support at least one layer, comprising a prefogged direct-positive silver halide emulsion spectrally sensitized with one or more electron-accepting sensitizing dyes in a total amount of at least 0.15 mmole/mole silver halide, the silver halide crystals of said prefogged direct-positive silver halide emulsion containing silver chloride for at least 60 mole %, silver bromide in a range from 0.5 mole % to 39.98 mole % and silver iodide in a range from 0.02 mole % to 2 mole %, characterized in that said silver halide cristals contain silver iodide for at least 0.20 mmole/mole AgX in the outer 10% by weight of said cristals and said layer contains a gelatin species containing $Ca^{2+}$ in an amount ranging from 0.2 % to 1 % by weight.

2. A photographic material according to claim 1 wherein said silver halide cristals contain silver iodide from 1.0 mmole/mole AgX to 5.0 mmole/mole AgX in the outer 2 % by weight of said silver halide cristals.

3. A photographic material according to claim 1 wherein said $Ca^{2+}$ containing gelatin species in a 10% by weight aqueous solution at 36° C. and pH 6 has a viscosity from 10 mPas to 17 mPas at a shearing rate of 1000 $s^{-1}$.

4. A photographic material according to claim 1 wherein said $Ca^{2+}$ containing gelatin species is comprised in the prefogged direct-positive silver halide emulsion layer in an amount ranging from 10 g/mole AgX to 200 g/mole AgX.

5. A photographic material according to claim 1 wherein said one or more electron-accepting spectral sensitizers are comprised in the prefogged direct-positive silver halide emulsion layer in a total amount from 0.50 mmole/mole AgX to 2.50 mmole/mole AgX.

6. A photographic material according to claim 1 wherein the pAg in the prefogged direct-positive silver halide emulsion layer is at least 6.8.

7. A method for obtaining a photographic material as described in claim 1 by preparing a prefogged direct-positive silver halide emulsion comprising the steps of (i) formation of a silver halide emulsion by precipitation in an aqueous medium of silver halide crystals containing silver chloride for at least 60 mole %, silver bromide in a range from 0.50 mole % to 39.98 mole % and silver iodide in a range from 0.020 mole % to 2.0 mole %, (ii) desalination of said silver halide emulsion, (iii) prefogging of said silver halide emulsion, (iv) adding one or more electron-accepting sensitizing dyes to said prefogged silver halide emulsion in a total amount of at least 0.15 mmole/mole silver halide and (v) adjusting the pH of said spectrally sensitized prefogged silver halide emulsion so as to obtain a photographic material with a pH at 25° C. of at most 7 and coating on a support at least said spectrally sensitized prefogged silver halide emulsion layer, characterized in that one or more water soluble iodide salts are added to the emulsion of said silver halide cristals in a stage after the addition of at least 90% of the silver salt in a total amount from 0.20 mmole/mole AgX to 0.020 mole/mole AgX and a gelatin species containing $Ca^{2+}$ in an amount ranging from 0.20% to 1% by weight is added to said aqueous medium before adding said one or more electron-accepting sensitizing dyes to said prefogged silver halide emulsion.

8. A method according to claim 7 wherein water soluble iodide salt(s) are also added to the prefogged direct-positive silver halide emulsion after the addition of the electron-accepting sensitizing dye(s) as the next step in the preparation of said emulsion in a total amount from 0.10 mmole/mole AgX to 4 mmole/mole AgX.

9. A method for obtaining a positive image comprising information-wise exposing a photographic material as defined in claim 1 and subsequently developing said photographic material in an alkaline processing liquid in the presence of developing agents.

10. A photographic material according to any of claims 1 to 6 wherein on said support is also coated an image receiving layer containing physical development nuclei in water permeable relationship with said silver halide emulsion layer.

11. A method for making a negative offset printing plate according to the silver salt diffusion transfer process comprising the steps of:

information-wise exposing an imaging element obtained by the method of claim 10, wherein said spectrally sensitized prefogged direct-positive silver halide emulsion layer is coated beneath said image receiving layer containing physical development nuclei and developing said imaging element using an alkaline processing liquid in the presence of developing agent(s) and silver halide solvents.

12. A method for making an offset printing plate according to the silver salt diffusion transfer process comprising the steps of:

information-wise exposing an imaging element obtained by the method of claim 10, wherein said support has a hydrophilic surface and said spectrally sensitized prefogged direct-positive silver halide emulsion layer is coated above said image receiving layer containing physical development nuclei, applying an aqueous alkaline solution to the imaging element in the presence of developing agent(s) and silver halide solvent(s) to form a silver image in said image receiving layer, treating the imaging element to remove the layer(s) on top of the image receiving layer, thereby exposing the imaged surface of the support by uncovering said silver image formed in said image receiving layer.

* * * * *